(12) United States Patent
Jiang et al.

(10) Patent No.: US 12,356,698 B2
(45) Date of Patent: Jul. 8, 2025

(54) METHOD OF FORMING A SEALED CAVITY EMBEDDED IN A SEMICONDUCTOR WAFER

(71) Applicant: Analog Devices, Inc., Wilmington, MA (US)

(72) Inventors: Yingqi Jiang, Bedford, MA (US); James G. Fiorenza, Carlisle, MA (US)

(73) Assignee: Analog Devices, Inc., Wilmington, MA (US)

( * ) Notice: Subject to any disclaimer, the term of this patent is extended or adjusted under 35 U.S.C. 154(b) by 616 days.

(21) Appl. No.: 17/697,758

(22) Filed: Mar. 17, 2022

(65) Prior Publication Data

US 2023/0299172 A1 Sep. 21, 2023

(51) Int. Cl.
| | |
|---|---|
| *H10D 64/68* | (2025.01) |
| *H01L 23/31* | (2006.01) |
| *H10D 30/47* | (2025.01) |
| *H10D 62/85* | (2025.01) |
| *H10D 64/00* | (2025.01) |

(52) U.S. Cl.
CPC ......... *H10D 64/687* (2025.01); *H01L 23/315* (2013.01); *H10D 30/472* (2025.01); *H10D 62/8503* (2025.01); *H10D 64/118* (2025.01); *H10D 64/685* (2025.01)

(58) Field of Classification Search
CPC . H01L 29/515; H01L 29/2003; H01L 29/408; H01L 29/513; H01L 29/7781; H01L 23/315; H01L 21/56; H01L 21/31111; H01L 23/4821; H01L 23/291; H01L 23/3135; H01L 23/3192; H01L 23/3171; H10D 62/8503; H10D 30/472; H10D 30/475; H10D 64/687; H10D 64/118; H10D 64/685; H10D 64/256
See application file for complete search history.

(56) References Cited

U.S. PATENT DOCUMENTS 6,297,072 B1 * 10/2001 Tilmans ................ B81B 7/0077
438/456
7,250,643 B2 * 7/2007 Nishi .................. H01L 23/4821
257/256

(Continued)

FOREIGN PATENT DOCUMENTS

| CN | 111710715 A | * | 9/2020 |
|---|---|---|---|
| CN | 116779457 A | | 9/2023 |
| WO | WO-2018185839 A1 | | 10/2018 |

OTHER PUBLICATIONS

"European Application Serial No. 23161872.9, Extended European Search Report mailed Dec. 18, 2023", 14 pgs (Year: 2023).*

(Continued)

*Primary Examiner* — William B Partridge
*Assistant Examiner* — Chevy J Boegel
(74) *Attorney, Agent, or Firm* — Schwegman Lundberg & Woessner, P.A.

(57) ABSTRACT

Techniques are described for forming a sealed cavity within a semiconductor wafer, where a conductor wafer includes a structure, such as a T-gate electrode or passive component, formed over a substrate. The sealed-cavity structure may be embedded into the wafer without interfering with any subsequent processes. That is, once the cavity is closed, any subsequent backend processes may continue as usual.

10 Claims, 4 Drawing Sheets

(56) References Cited

U.S. PATENT DOCUMENTS

| | | | | |
|---|---|---|---|---|
| 2005/0118823 A1* | 6/2005 | Kawashima | ........ | H01L 21/0209 438/692 |
| 2005/0274977 A1* | 12/2005 | Saito | .................... | H10D 64/251 257/280 |
| 2006/0118823 A1* | 6/2006 | Parikh | ................ | H10D 30/4755 257/E27.012 |
| 2015/0295074 A1* | 10/2015 | Ozaki | ............... | H01L 21/02348 257/194 |

OTHER PUBLICATIONS

"European Application Serial No. 23161872.9, Extended European Search Report mailed Dec. 18, 2023", 14 pgs.

"European Application Serial No. 23161872.9, Partial European Search Report mailed Aug. 17, 2023", 12 pgs.

"European Application Serial No. 23161872.9, Response filed Feb. 7, 2024 to Extended European Search Report mailed Dec. 18, 2023", 16 pgs.

Chen, Zhe, "Recent research and development of thick CVD tungsten coatings for fusion application", Tungsten 2, https://doi.org/10.1007/s42864-020-00041-x, (2020), 83-93.

Je, Chang Han, "Surface Micromachined Pressure Sensor with Internal Substrate Vacuum Cavity", ETRI Journal, 38 (4), http://dx.doi.org/10.4218/etrij.16.0015.0025, (Aug. 2016), 685-694.

Lin, Wei-Chien, "Sensitivity Improvement for CMOS-MEMS Capacitive Pressure Sensor Using Double Deformable Diaphragms with Trenches", Transducers 2017, Kaohsiung, Taiwan, IEEE, (Jun. 18-22, 2017), 782-785.

Zaghloul, Usama, "Nanoscale characterization of the dielectric charging phenomenon in PECVD silicon nitride thin films with various interfacial structures based on Kelvin probe force microscopy", Nanotechnology, 22(20), IOP Publishing Ltd, http://iopscience.iop.org/0957-4484/22/20/205708, (2011), 27 pgs.

* cited by examiner

METHOD OF FORMING A SEALED CAVITY EMBEDDED IN A SEMICONDUCTOR WAFER

STATEMENT REGARDING FEDERALLY SPONSORED RESEARCH OR DEVELOPMENT

This invention was made with government support under Grant No. HR0011-18-3-0014 awarded by the Defense Advanced Research Projects Agency (DARPA). The government has certain rights in the invention.

FIELD OF THE DISCLOSURE

This document pertains generally, but not by way of limitation, to semiconductor devices, and more particularly, to techniques for constructing semiconductor devices.

BACKGROUND

Gallium nitride (GaN) based semiconductors offer several advantages over other semiconductors as the material of choice for fabricating the next generation of transistors, or semiconductor devices, for use in both high voltage and high frequency applications. GaN based semiconductors, for example, have a wide bandgap that enable devices fabricated from these materials to have a high breakdown electric field and to be robust to a wide range of temperatures.

The two-dimensional electron gas (2DEG) channels formed by GaN based heterostructures generally have high electron mobility, making devices fabricated using these structures useful in power-switching and amplification systems.

SUMMARY OF THE DISCLOSURE

This disclosure describes techniques for forming a sealed cavity within a semiconductor wafer, e.g., GaN wafer, where a conductor wafer includes a structure, such as a T-gate electrode or passive component, formed over a substrate. The techniques of this disclosure do not involve using another capping wafer to seal the cavity. The sealed-cavity structure may be embedded into the wafer without interfering with any subsequent processes. That is, once the cavity is closed, any subsequent backend processes may continue as usual. The techniques of this disclosure may increase the freedom of routing, reduce the layout complexity, and improve the performance.

In some aspects, this disclosure is directed to a method of forming a sealed cavity within a semiconductor wafer, wherein the semiconductor wafer includes a structure formed over a substrate, the method comprising: patterning a region of a passivation layer, removing at least a portion of the patterned region of the passivation layer to form at least one hole; removing, through the at least one hole formed in the passivation layer, a portion of an underlying insulating layer around the structure to form a cavity; and covering or sealing the at least one hole in the passivation layer to form the sealed cavity.

In some aspects, this disclosure is directed to a semiconductor device including a sealed cavity, the semiconductor device comprising: a substrate; a structure formed over the substrate, wherein the structure is positioned within the cavity; a passivation layer formed over the cavity, wherein the passivation layer defines at least one hole; and a cover or sealant formed over the passivation layer, the cover or sealant including a material deposited in and configured to block the at least one hole to cover or seal the cavity.

In some aspects, this disclosure is directed to a semiconductor device including a sealed cavity, the semiconductor device comprising: a gallium nitride substrate; a T-gate electrode structure formed over the gallium nitride substrate, wherein the T-gate electrode structure is positioned within the cavity; a passivation layer formed over the cavity, wherein the passivation layer defines at least one hole; and a cover or sealant formed over the passivation layer, the cover or sealant including a material deposited in and configured to block the at least one hole to cover or seal the cavity.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1A:
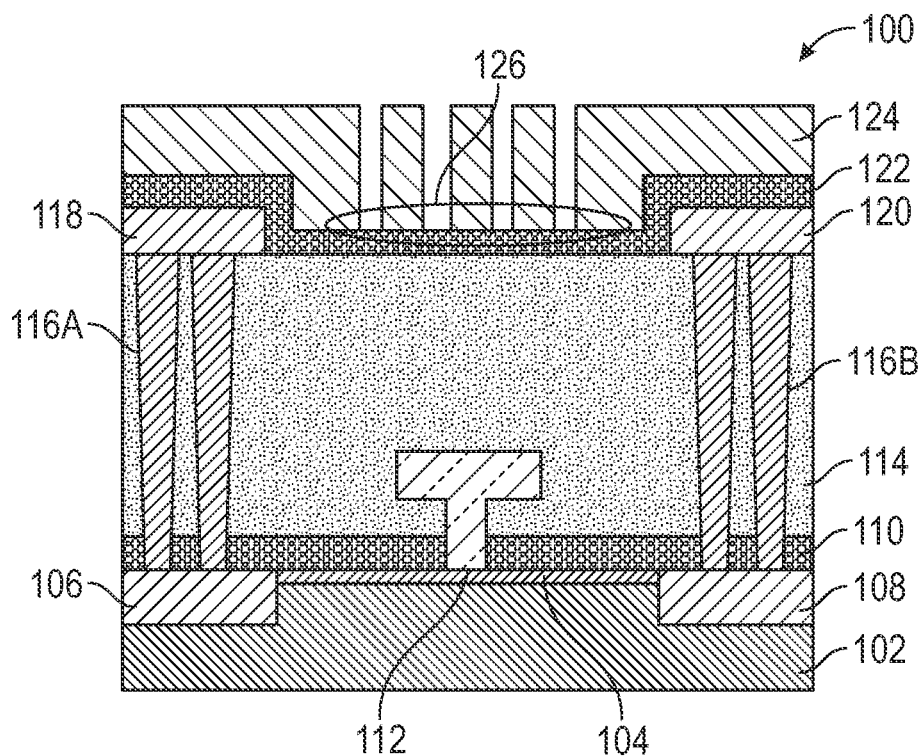
FIGS. 1A-1F depict an example of a process fabrication flow of forming a sealed cavity within a semiconductor wafer, where the semiconductor wafer includes a structure formed over a substrate, in accordance with various techniques of this disclosure.

Gallium nitride (GaN) based semiconductors are an attractive option for high frequency and high-power applications. To operate at high frequency, such as 94 GHz, three-dimensional (3D) structures, such as T-gate electrodes, have been used in the GaN devices. Such 3D structures typically need to be formed in the air without solid material (such as an insulating dielectric) existing above and on the sides of the T-gate. The lack of an insulating dielectric reduces the parasitic capacitance from the source and the drain of the device to the T-gate and increases its frequency limit.

The present inventors have recognized that such requirements for 3D structures may lead to multiple limitations. For example, few subsequent processes may be performed once a T-gate electrode is formed; otherwise, it risks burying the 3D structure. Another prominent issue is that it may not allow multi-layer metal routing (to integrate with other devices) and/or thick passivation costing (for reliability). Finally, when exposed to the air, the device is subject to the environmental impact, such as humidity and oxygen. While advanced packaging may alleviate the issue, it may increase the cost and device volume.

This disclosure describes techniques for forming a sealed cavity within a semiconductor wafer, e.g., GaN wafer, where a conductor wafer includes a structure, such as a T-gate electrode or passive component, formed over a substrate. The techniques of this disclosure do not involve using another capping wafer to seal the cavity. The sealed-cavity structure may be embedded into the wafer without interfering with any subsequent processes. That is, once the cavity is closed, any subsequent backend processes may continue as usual. The techniques of this disclosure may increase the freedom of routing, reduce the layout complexity, and improve the performance.

As used in this disclosure, a GaN-based compound semiconductor material may include a chemical compound of elements including GaN and one or more elements from different groups in the periodic table. Such chemical compounds may include a pairing of elements from group 13 (i.e., the group comprising boron (B), aluminum (Al), gallium (Ga), indium (In), and thallium (Tl) with elements from group 15 (i.e., the group comprising nitrogen (N), phosphorus (P), arsenic (As), antimony (Sb), and bismuth (Bi)). Group 13 of the periodic table may also be referred to as Group III and group 15 as Group V. In an example, a semiconductor device may be fabricated from GaN and aluminum indium gallium nitride (AlInGaN).

Heterostructures described herein may be formed as AlN/GaN/AlN hetero-structures, InAlN/GaN heterostructures, AlGaN/GaN heterostructures, or heterostructures formed from other combinations of group 13 and group 15 elements. These heterostructures may form a two-dimensional electron gas (2DEG) at the interface of the compound semiconductors that form the heterostructure, such as the interface of GaN and AlGaN. The 2DEG may form a conductive channel of electrons that may be controllably depleted, such as by an electric field originating from the gate of the device. The conductive channel of electrons that may also be controllably enhanced, such as by an electric field formed by a gate electrode disposed above the channel to control a current through the semiconductor device. Semiconductor devices formed using such conductive channels may include high electron mobility transistors.

FIGS. 1A-1F depict an example of a process fabrication flow of forming a sealed cavity within a semiconductor wafer, where the semiconductor wafer includes a structure formed over a substrate, in accordance with various techniques of this disclosure. A portion of a semiconductor wafer is shown in FIG. 1A. The semiconductor device 100, e.g., compound semiconductor heterostructure transistor device, shown may include a substrate 102, which may be a semiconductor material, such as a GaN heterostructure.

In some examples, the semiconductor device 100 may be a high-electron mobility transistor (HEMT) structure. The substrate 102 may have a two-dimensional electron gas (2DEG) channel region 104, where the 2DEG channel is more conductive than either layer of the heterostructure. The semiconductor device of this disclosure may be desirable for power applications or RF applications.

The semiconductor device 100 may include a drain electrode 106 and a source electrode 108. The drain electrode 106 and the source electrode 108 may be in contact with the 2DEG channel 104.

The semiconductor device 100 may include a first passivation layer 110 formed over or superjacent the substrate 104 and over or superjacent the 2DEG channel region 104, e.g., of a HEMT structure. As an example, the first passivation layer 110 may include silicon nitride (SiN).

The semiconductor device 100 may include a three-dimensional (3D) structure 112 formed over or superjacent the substrate 102. In some examples, the structure 112 may include a T-gate electrode. The T-gate electrode may extend through the first passivation layer 110 and be coupled to the channel region 104.

In some examples, the T-gate electrode may include gold. In other examples, the T-gate electrode may be silicon-compatible and not include gold. In some examples, the structure 112 may include one or more passive components, such as inductors, resistors, and/or capacitors.

The semiconductor device 100 may further include an electrically insulating layer 114. As seen in FIG. 1A, the structure 112 is surrounded by the electrically insulating layer 114.

The semiconductor device 100 may further include vias 116A, 116B, e.g., such as including tungsten, to extend between and couple the drain electrode 106 and the source electrode 108 to corresponding metal regions 118, 120 near the top of the semiconductor device 100, where the metal regions 118, 120 may be positioned under the second passivation layer 122.

The semiconductor device 100 may include a second passivation layer 122 formed over the metal regions 118, 120 and the electrically insulating layer 114, such as an oxide. As an example, the second passivation layer 122 may include silicon nitride (SiN).

A photoresist layer 124 may be formed over the second passivation layer 122. As seen in FIG. 1A, the process fabrication flow may include patterning a region 126 of the second passivation layer 122. For example, the process fabrication flow may include using the photoresist layer 124 to pattern a region 126 of silicon nitride to define permeable holes.

Figure 1B:
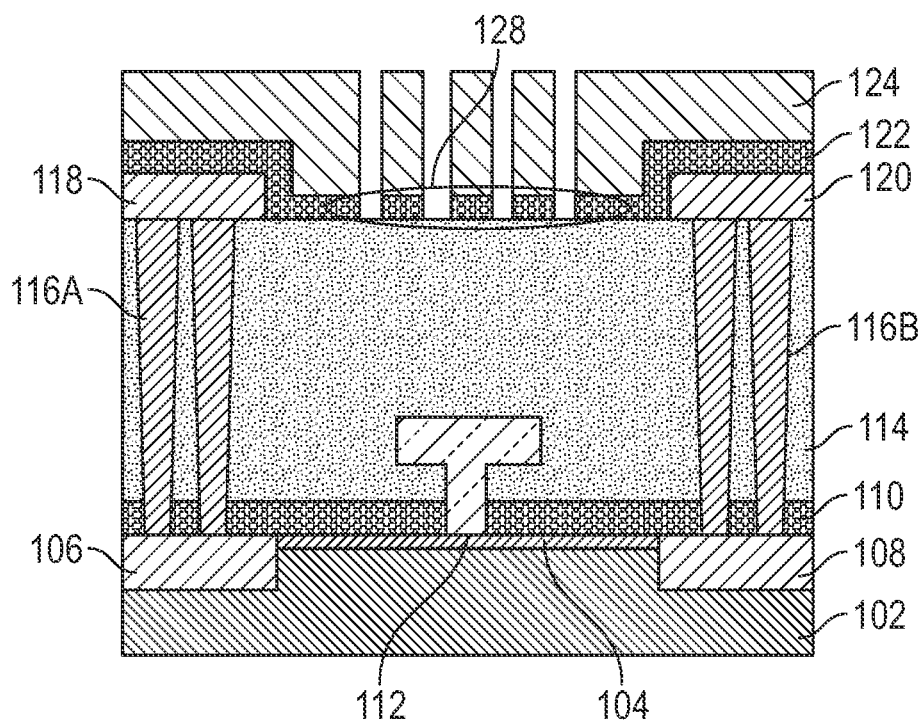

Referring to FIG. 1B, the process flow may include removing at least a portion of the patterned region of the second passivation layer 122 to form at least one hole. For example, at least a portion of silicon nitride may be removed, such as by etching, to form one or more holes 128. In some examples, the one or more holes 128 may be nanometer-sized holes. In this manner, a permeable membrane may be formed.

Figure 1C:
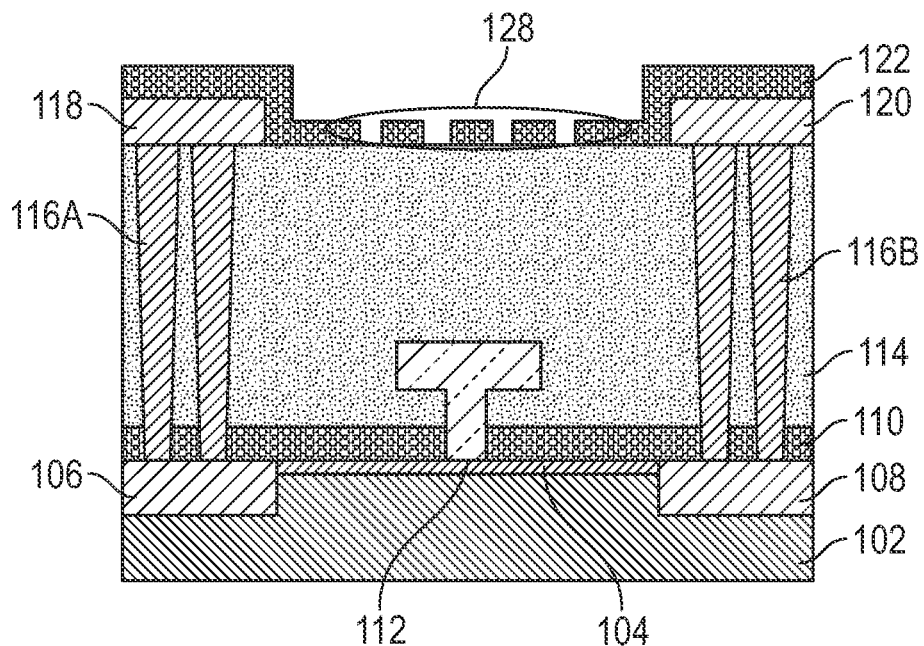

Referring to FIG. 1C, the process flow may include stripping or otherwise removing the photoresist layer 124.

Figure 1D:
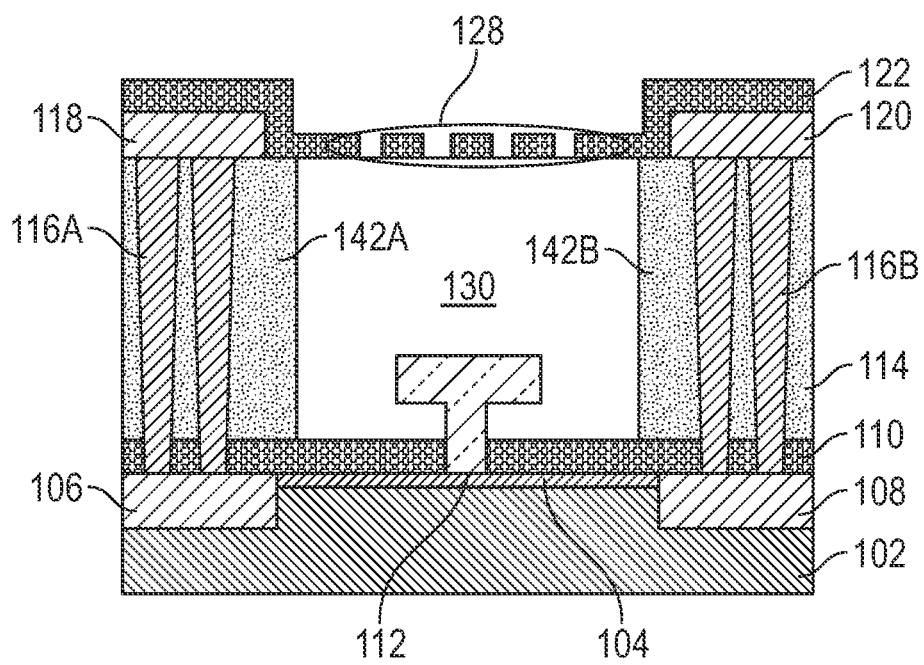

Referring to FIG. 1D, the process flow may include removing, through the hole(s) 128 formed in the second passivation layer 122, a portion of the underlying insulating layer 114 about or around the structure 112 to form a cavity 130. As seen in FIG. 1D, the structure 112 is positioned with the cavity 130. In some examples, a hydrofluoric acid, e.g., vapor hydrofluoric acid, may be applied to the electrically insulating layer 114 through the hole(s) 128 of the permeable membrane, such as to etch away the electrically insulating layer 114 around the structure 112, to release or free the structure 112 from the electrically insulating layer 114.

In some examples, the photoresist layer 124 may be removed before removing, through the at least one hole formed in the passivation layer, the portion of an underlying insulating layer 114, such as when using vapor hydrofluoric acid to etch away the insulating layer 114. When using other techniques to remove the electrically insulating layer 114, it may be desirable to remove the photoresist layer 124 after the removing electrically insulating layer 114, such that the photoresist layer 124 acts as a reinforced passivation layer.

In some examples, portions 142A, 142B of the underlying insulating layer 114 that are adjacent sides of the sealed cavity 130 may be retained.

Figure 1E:
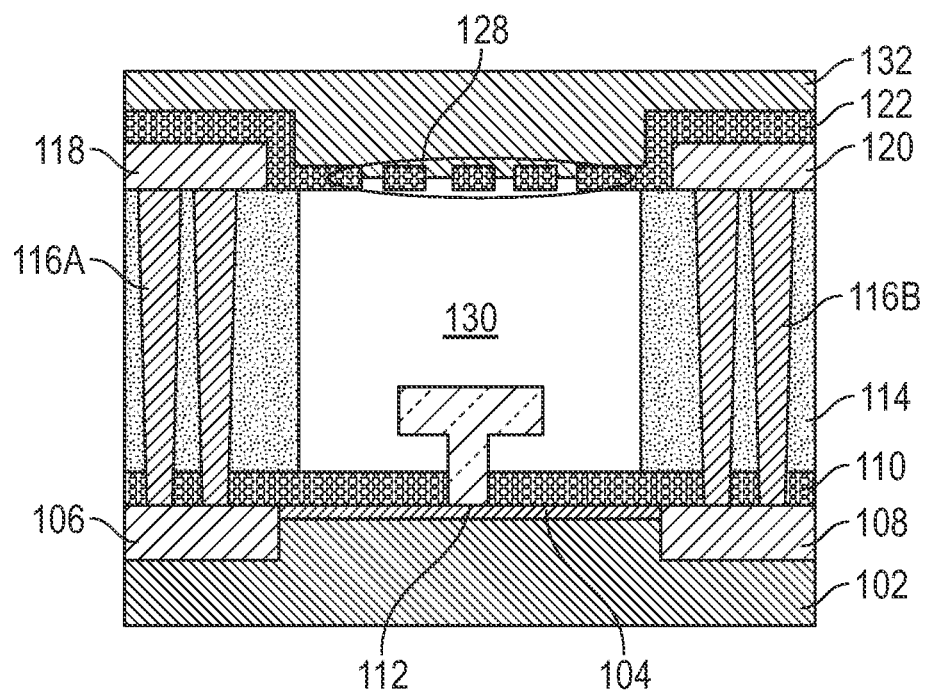

Referring to FIG. 1E, the process flow may include covering or sealing the hole(s) 128 in the passivation layer to form the sealed cavity 130. For example, a cover or sealant formed of a material 132 may be deposited to block the hole(s) 128 to cover or seal the cavity 130. In some examples, a nitride or oxide may be deposited. For example, plasma-enhanced chemical vapor deposition (PECVD)

nitride or PECVD oxide may be used to seal the hole(s) 128. In other examples, a metal may be used to seal the hole(s) 128.

Figure 1F:
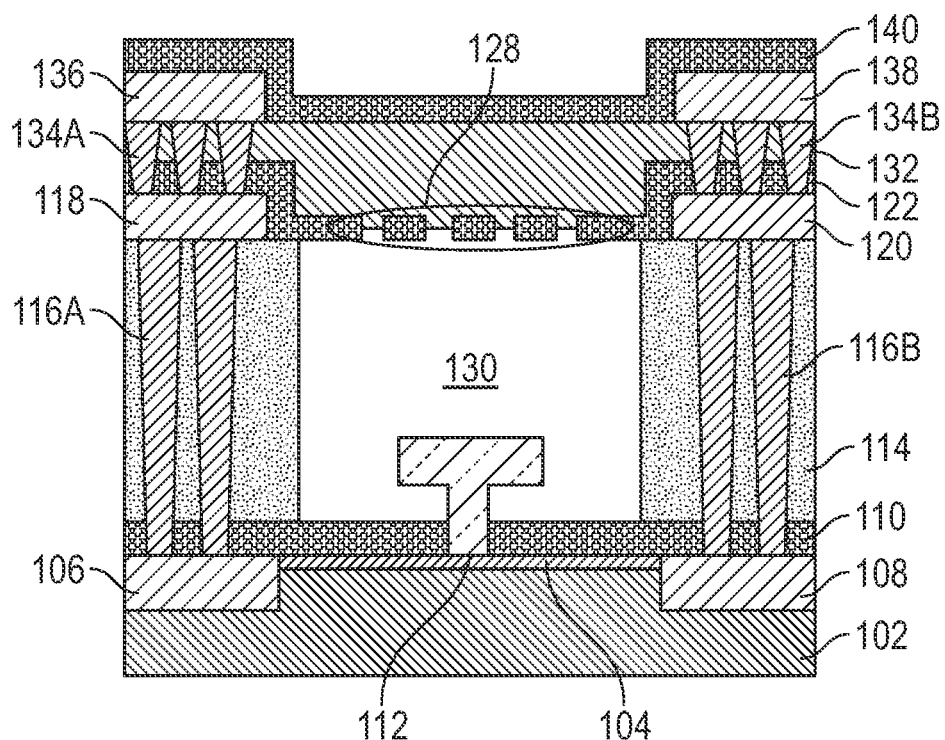

The deposition of material 132 may result in surface irregularities on the top surface of the material 132. In some examples, it may be desirable to smooth or flatten the top surface of the material 132 to remove those irregularities, such as to allow the process flow to continue to one or more additional, e.g., optional, process flow steps, such as shown in FIG. 1F. As an example, chemical mechanical planarization (CMP) may be used to create a smooth surface.

In some examples, the process flow may include controlling a pressure, e.g., such as creating a vacuum, within the sealed cavity 130. Such control may be achieved during the sealing process in FIG. 1E depending on sealing materials and sealing conditions. For example, PECVD SiN may be deposited, such as in the range of about 650-1000 mTorr (0.087-0.133 kPa). In another example, CVD tungsten (W) metal may be deposited, such as in the range of 1.333-101.325 kPa (atm).

In other examples, the process flow may include controlling a gas composition in the sealed cavity 130, which may optimize the gas composition in the sealed cavity 130. For example, close to the end of sealing stage, inert carrying gas, such as argon (Ar) or nitrogen ($N_2$), may be increased in terms of relative ratio so that the final sealed gas is dominated by the inert gas.

Referring to FIG. 1F, the process flow may include one or more additional, e.g., optional, processes once the hole(s) 128 are sealed. A non-limiting example of an additional backend process is shown in FIG. 1F. In FIG. 1F, additional vias 134A, 134B may be formed to electrically couple the metal region 118 and the metal region 120 to corresponding metal regions 136, 138. A third passivation layer 140, e.g., silicon nitride, may be formed over the metal regions 136, 138 and over the cover or sealant that includes the material 132.

Figure 2:
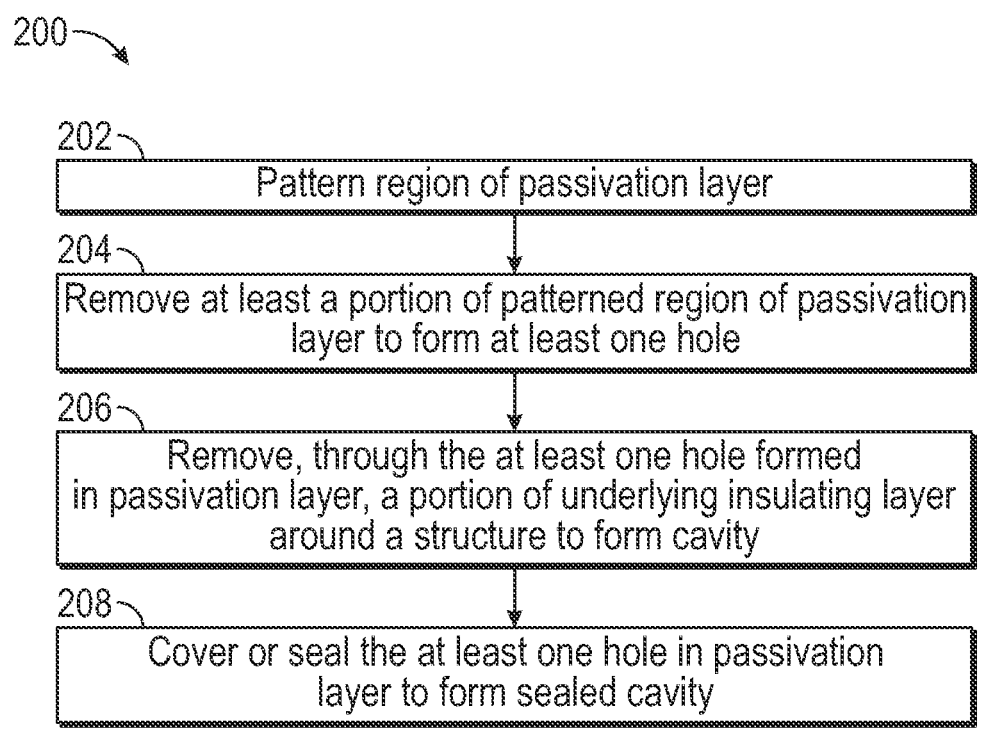
FIG. 2 is an example of a flow diagram of a method 200 of forming a sealed cavity within a semiconductor wafer, such as where the semiconductor wafer includes a structure formed over a substrate.

FIG. 2 is an example of a flow diagram of a method 200 of forming a sealed cavity within a semiconductor wafer, such as where the semiconductor wafer includes a structure formed over a substrate. At block 202, the method 200 may include patterning a region of a passivation layer.

At block 204, the method 200 may include removing at least a portion of the patterned region of the passivation layer to form at least one hole. In some examples, the method may include using a photoresist layer to pattern the region of the passivation layer At block 206, the method 200 may include removing, through the at least one hole formed in the passivation layer, a portion of an underlying insulating layer around the structure to form a cavity.

At block 208, the method 200 may include covering or sealing the at least one hole in the passivation layer to form the sealed cavity.

In some examples, the method may include retaining another portion of the underlying insulating layer that is adjacent sides of the sealed cavity.

In some examples, the structure includes a T-gate electrode. In some examples, the method may include coupling the T-gate electrode to a two-dimensional gas (2DEG) channel region of a high-electron mobility transistor (HEMT) structure. In some examples, the HEMT structure includes a gallium nitride substrate.

In some examples, covering or sealing the at least one hole in the passivation layer to form the sealed cavity may include depositing a material to seal the at least one hole, such as depositing a nitride or an oxide to seal the at least one hole.

In some examples, the method patterning the region of the passivation layer may include using a photoresist layer to pattern the region of the passivation layer. In some examples, removing the photoresist layer before removing, through the at least one hole formed in the passivation layer, the portion of an underlying insulating layer.

In some examples, removing, through the at least one hole formed in the passivation layer, a portion of an underlying insulating layer about the structure to form the cavity may include applying hydrofluoric acid to the insulating layer through the at least one hole.

In some examples, the method may include controlling a pressure within the sealed cavity. In some examples, the method may include controlling a gas composition in the sealed cavity.

Various Notes

Each of the non-limiting aspects or examples described herein may stand on its own or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following aspects, the terms "including" and "comprising" are open-ended, that is, a system, device, article, composition, formulation, or process that includes elements in addition to those listed after such a term in an aspect are still deemed to fall within the scope of that aspect. Moreover, in the following aspects, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the aspects. Also, in the above Detailed Description, various features may be grouped together to streamline the disclosure. This should not be interpreted as intending that an unclaimed disclosed feature is essential to any aspect. Rather, inventive subject matter may lie in less than all features of a particular disclosed embodiment. Thus, the following aspects are hereby incorporated into the Detailed Description as examples or embodiments, with each aspect standing on its own as a separate embodiment, and it is contemplated that such embodiments may be combined with each other in various combinations or permutations. The scope of the invention should be determined with reference to the appended aspects, along with the full scope of equivalents to which such aspects are entitled.

The claimed invention is:

1. A method of forming a sealed cavity within a semiconductor wafer, wherein the semiconductor wafer includes a structure formed over a substrate, the method comprising:

forming a drain electrode and a source electrode over the substrate;

forming a first plurality of vias that extend vertically between the drain electrode and a first metal region;

forming a second plurality of vias that extend vertically between the source electrode and a second metal region;

patterning a region of a passivation layer;

removing at least a portion of the patterned region of the passivation layer to form at least one hole;

removing, through the at least one hole formed in the passivation layer, a portion of an underlying insulating layer around the structure to form a cavity by applying vapor hydrofluoric acid to the insulating layer through the at least one hole, retaining a first portion of the insulating layer, wherein the first portion extends vertically and is adjacent to at least one of the first plurality of vias, and retaining a second portion of the insulating layer, wherein the second portion extends vertically and is adjacent to at least one of the second plurality of vias, and wherein the first portion and the second portion are adjacent to sides of the cavity; and covering or sealing the at least one hole in the passivation layer to form the sealed cavity.

2. The method of claim 1, wherein the structure includes a T-gate electrode.

3. The method of claim 2, comprising:

coupling the T-gate electrode to a two-dimensional gas (2DEG) channel region of a high-electron mobility transistor (HEMT) structure.

4. The method of claim 3, wherein the HEMT structure includes a gallium nitride substrate.

5. The method of claim 1, wherein covering or sealing the at least one hole in the passivation layer to form the sealed cavity includes:

depositing a material to seal the at least one hole.

6. The method of claim 5, wherein depositing the material to seal the at least one hole includes:

depositing a nitride or an oxide to seal the at least one hole.

7. The method of claim 1, wherein patterning the region of the passivation layer includes:

using a photoresist layer to pattern the region of the passivation layer.

8. The method of claim 7, comprising:

removing the photoresist layer before removing, through the at least one hole formed in the passivation layer, the portion of an underlying insulating layer.

9. The method of claim 1, comprising:

controlling a pressure within the sealed cavity.

10. The method of claim 1, comprising:

controlling a gas composition in the sealed cavity.

* * * * *